(12) United States Patent
Chou et al.

(10) Patent No.: US 11,450,747 B2
(45) Date of Patent: Sep. 20, 2022

(54) SEMICONDUCTOR STRUCTURE WITH AN EPITAXIAL LAYER

(71) Applicant: UNITED MICROELECTRONICS CORP., Hsin-Chu (TW)

(72) Inventors: Hsiao-Pang Chou, Taipei (TW); Hon-Huei Liu, Kaohsiung (TW); Ming-Chang Lu, Changhua County (TW); Chin-Fu Lin, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 66 days.

(21) Appl. No.: 17/218,112

(22) Filed: Mar. 30, 2021

(65) Prior Publication Data

US 2021/0242018 A1   Aug. 5, 2021

Related U.S. Application Data

(62) Division of application No. 16/242,994, filed on Jan. 8, 2019, now Pat. No. 11,011,376.

(30) Foreign Application Priority Data

Dec. 12, 2018   (CN) .......................... 201811517688.5

(51) Int. Cl.
*H01L 29/04* (2006.01)
*H01L 29/20* (2006.01)
(Continued)

(52) U.S. Cl.
CPC ...... *H01L 29/2003* (2013.01); *H01L 21/0243* (2013.01); *H01L 21/0254* (2013.01);
(Continued)

(58) Field of Classification Search
CPC . H01L 29/165; H01L 33/007; H01L 29/2003; H01L 33/16; H01L 29/045;
(Continued)

(56) References Cited

U.S. PATENT DOCUMENTS 6,348,096 B1   2/2002   Sunakawa
7,109,530 B2 *  9/2006   Hayashi .............. H01L 21/0242
                                                  257/E21.127
(Continued)

*Primary Examiner* — Shouxiang Hu
(74) *Attorney, Agent, or Firm* — Winston Hsu

(57) ABSTRACT

The present invention discloses a semiconductor structure with an epitaxial layer, including a substrate, a blocking layer on said substrate, wherein said blocking layer is provided with predetermined recess patterns, multiple recesses formed in said substrate, wherein each of said multiple recesses is in 3D diamond shape with a centerline perpendicular to a surface of said substrate, a buffer layer on a surface of each of said multiple recesses, and an epitaxial layer comprising a buried portion formed on said buffer layer in each of said multiple recesses and only one above-surface portion formed directly above said blocking layer and directly above said recess patterns of said blocking layer, and said above-surface portion directly connects said buried portion in each of said multiple recesses, and a first void is formed inside each of said buried portions of said epitaxial layer in said recess.

9 Claims, 3 Drawing Sheets

(51) Int. Cl.
*H01L 21/02* (2006.01)
*H01L 29/06* (2006.01)
*H01L 21/308* (2006.01)
*H01L 21/306* (2006.01)
*H01L 23/00* (2006.01)
*H01L 33/00* (2010.01)
*H01L 33/12* (2010.01)
*H01L 33/16* (2010.01)
*H01L 29/165* (2006.01)

(52) U.S. Cl.
CPC .. *H01L 21/02381* (2013.01); *H01L 21/02433* (2013.01); *H01L 21/02458* (2013.01); *H01L 21/02647* (2013.01); *H01L 21/308* (2013.01); *H01L 21/30604* (2013.01); *H01L 23/562* (2013.01); *H01L 29/04* (2013.01); *H01L 29/045* (2013.01); *H01L 29/0603* (2013.01); *H01L 29/165* (2013.01); *H01L 33/007* (2013.01); *H01L 33/12* (2013.01); *H01L 33/16* (2013.01)

(58) Field of Classification Search
CPC . H01L 33/12; H01L 29/0649; H01L 21/0254; H01L 21/30604; H01L 21/308; H01L 21/02381; H01L 21/0243; H01L 23/562; H01L 29/0603; H01L 21/02647; H01L 21/02458; H01L 21/02433
See application file for complete search history.

(56) References Cited

U.S. PATENT DOCUMENTS

| | | |
|---|---|---|
| 7,179,667 B2 | 2/2007 | Okagawa |
| 7,589,001 B2 | 9/2009 | Tadatomo |
| 10,043,663 B2 | 8/2018 | Cheng |
| 10,134,735 B2 | 11/2018 | Chang |
| 10,199,220 B2 | 2/2019 | Reznicek |
| 2004/0183078 A1 | 9/2004 | Wang |
| 2006/0084245 A1 | 4/2006 | Kohda |
| 2008/0224151 A1* | 9/2008 | Hata .................. H01S 5/22 257/86 |
| 2009/0261376 A1 | 10/2009 | Hwang |
| 2016/0005736 A1* | 1/2016 | Xiao ............... H01L 21/30608 438/283 |

* cited by examiner

SEMICONDUCTOR STRUCTURE WITH AN EPITAXIAL LAYER

CROSS REFERENCE TO RELATED APPLICATIONS

This application is a divisional of application Ser. No. 16/242,994, filed on Jan. 8, 2019 and entitled "METHOD OF MANUFACTURING SEMICONDUCTOR STRUCTURE WITH AN EPITAXIAL LAYER", which is incorporated herein by reference.

BACKGROUND OF THE INVENTION

1. Field of the Invention

The present invention relates generally to a semiconductor structure with an epitaxial layer, and more specifically, to a semiconductor structure with an epitaxial layer buried in recesses of a substrate.

2. Description of the Prior Art

Gallium nitride (GaN) has excellent electric properties, such as high breakdown electric field, high electron saturation velocity, and low on-resistance, etc, so it is suitable to be used as a material for power devices. However, despite it having material characteristics better than conventional silicon material, the most serious problem of GaN material is that it is very difficult to manufacture large-sized chips. Regarding current GaN-on-Si substrate with lowest cost, it is manufactured by growing epitaxial GaN on a Si substrate. Since the coefficient of thermal expansion of GaN is far larger than the one of Si and the crystal lattices of them are highly mismatched, this unsuitable condition is liable to cause problems such as a crack, delamination, or dislocation defect of the GaN epitaxial layer, or wafer warpage issue during film growth or follow-up processing due to the cause of stress.

At present, there are some approaches adopted in the industry to overcome the aforementioned problems during the manufacture of GaN-on-Si substrate, for example, through the growth of multilayered heterogeneous AlGaN buffer layers beforehand on the silicon surface, or using Si substrate with micro patterns to grow the epitaxial structure. Although these approaches can address the aforementioned problems, the issue of high dislocation density and poor heat dissipation is still waiting to be solved urgently.

Therefore, it is still needed to further improve structures and relevant manufacturing processes of current GaN-on-Si substrate in the industry.

SUMMARY OF THE INVENTION

In order to further improve the structure of current GaN-on-Si substrate, the present invention provides a novel semiconductor structure, with the feature of an epitaxial layer formed with a buried portion buried in the substrate to improve problems of heat dissipation and defects in conventional GaN-on-Si substrate.

One purpose of the present invention is to provide a semiconductor structure with an epitaxial layer, including a substrate, a blocking layer on said substrate, wherein said blocking layer is provided with predetermined recess patterns, multiple recesses formed in said substrate, wherein each of said multiple recesses is in 3D diamond shape with a centerline perpendicular to a surface of said substrate, a buffer layer on a surface of each of said multiple recesses, and an epitaxial layer comprising a buried portion formed on said buffer layer in each of said multiple recesses and only one above-surface portion formed directly above said blocking layer and directly above said recess patterns of said blocking layer, and said above-surface portion directly connects said buried portion in each of said multiple recesses, and a first void is formed inside each of said buried portions of said epitaxial layer in said recess.

Another purpose of the present invention is to provide a method of manufacturing a semiconductor structure with an epitaxial layer, including steps of providing a substrate, forming a blocking layer on said substrate, wherein said blocking layer is provided with predetermined recess patterns, performing an etch process using said blocking layer as a mask to etch said substrate to form multiple recesses in said substrate, wherein each of said multiple recesses is in 3D diamond shape with a centerline perpendicular to a surface of said substrate, forming a buffer layer on a surface of each of said multiple recesses, and performing an epitaxy process to form an epitaxial layer on said buffer layers, wherein said epitaxial layer is provided with a buried portion formed in each of said multiple recesses and is provided with only one above-surface portion formed directly above said blocking layer and directly above said recess patterns of said blocking layer, and said above-surface portion directly connects said buried portion in each of said multiple recesses, and a first void is formed inside each of said buried portions of said epitaxial layer in said recess.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

Figure 1:
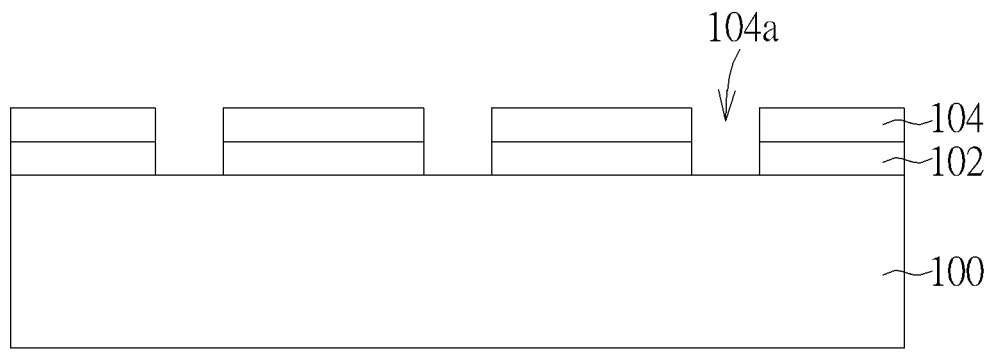
FIG. 1 to FIG. 3 are schematic cross-sections illustrating the process flow of a method of manufacturing a semiconductor structure with an epitaxial layer in accordance with the preferred embodiment of the present invention.
Figure 2:
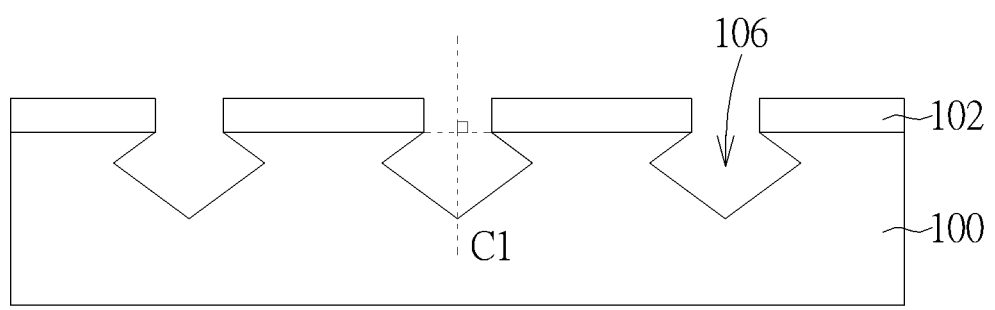
Figure 3:
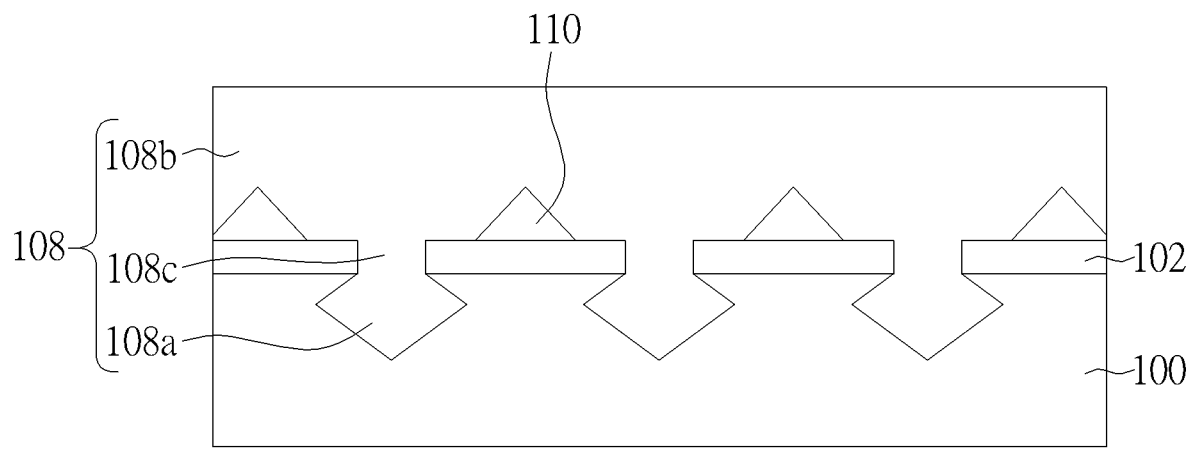

FIG. 1 to FIG. 3 sequentially illustrates the process flow of the method of manufacturing a semiconductor structure with an epitaxial layer in accordance with the preferred embodiment of the present invention. Please refer to FIG. 1. A substrate 100, such as a silicon substrate, SiC substrate, or sapphire substrate, is first provided to serve as a base for growing the epitaxial layer. A blocking layer 102 is then formed on the substrate 100. For example, use a chemical vapor deposition (CVD) process to form a silicon oxide layer or a silicon nitride layer. The blocking layer 102 would block the surface of the substrate 100, so that epitaxial structure will not be formed on the blocked portion in the epitaxy process. Thereafter, a patterned photoresist 104 is formed on the blocking layer 102. The photoresist 104 is provided with predetermined micro patterns 104a that may be formed by using advance maskless lithography technology such as E-beam or nano imprint.

In the embodiment of the present invention, micro pattern 104a may be symmetric pattern such as circle, square, or rectangle uniformly distributed on the surface of the substrate 100 in a predetermined density, with an opening size about 10 nm to 200 nm. The spacing between patterns 104a is not quite large, preferably double to triple size of the opening. A dry etch process is then performed to the blocking layer 102 using the photoresist 104 as a mask to transfer the patterns 104a in the photoresist 104 to the blocking layer 102. The pattern 104a in the blocking layer 102 would expose underlying substrate 100. The patterned photoresist 104 may be removed after patterning the blocking layer 102.

Next, please refer to FIG. 2. After the patterned blocking layer 102 is formed, an etch process is then performed using the patterned blocking layer 102 as an etch mask to form recesses 106 in the substrate. In the embodiment of the present invention, the etch process includes a slope wet etch process, and more specifically, a wet etch process using potassium hydroxide (KOH) etchant to etch the silicon substrate with <100> crystal faces, thereby forming recesses 106 in 3D diamond shape extending along the <111> crystal faces in the substrate 100, and the 3D diamond shape has a centerline C1 perpendicular to the surface of substrate 100 as shown in the figure. In the embodiment of the present invention, these recesses 106 with particular shape may shape the epitaxial structure formed therein to have corresponding shape in order to achieve the efficacy required by the present invention.

Next, please refer to FIG. 3. After the diamond-shaped recesses 106 are formed, an epitaxy process is then performed to form an epitaxial layer 108 on the substrate. The material of epitaxial layer 108 may be gallium nitride (GaN) or aluminum gallium nitride ($Al_xGa_yN$). Since the presence of the blocking layer 102, the epitaxial layer 108 would start to grow only from the surface of substrate 100 not covered by the blocking layer 102, i.e., from the surface of the recesses 106. Although the epitaxial layer 108 in the embodiment of the present invention start to grow from respective recesses 106, they will merge into a common epitaxial structure completely covering the entire surface of the substrate 100 after growing out of the recesses 106. In the embodiment of the present invention, the epitaxial layer 108 includes a buried portion 108a formed in each recess 106 and an above-surface portion 108b formed on the blocking layer 102. In addition, a middle portion 108c is formed in the blocking layer 102 between the buried portion 108a and the above-surface portion 108b to connect therebetween.

Refer again to FIG. 3. In the embodiment of the present invention, since the epitaxial layer 108 is formed from the surface of the substrate 100, it can be seen from the figure that voids 110 would be formed between the above-surface portion 108b of the epitaxial layer and the blocking layer 102, wherein each void 110 is formed respectively between two buried portions 108a. The formation of voids 110 between the epitaxial layer 108 and the blocking layer 102 may help to release stress on the epitaxial interface and solve the crack problem result from the lattice mismatch between the materials of epitaxial structure and the substrate. In addition, since the buried portion 108a of the epitaxial layer 108 formed in the recess 106 is in diamond shape, the shear stress generated at the epitaxial interface during thermal cycle may be effectively transformed into compressive stress to avoid wafer warpage or delamination. Furthermore, the buried portions 108a buried in the substrate may significantly increase the contact area between the epitaxial layer 108 and the substrate to improve the efficiency of heat dissipation of the entire substrate. Lastly, since the epitaxial layer 108 grows from the surface of the recesses 106 with <111> crystal faces, the inherent dislocation defects between the epitaxial layer and the substrate would be confined in the recesses 106 and would not spread upwardly to the above-surface portion 108b of the epitaxial layer 108, so that the above-surface portion 108b of the epitaxial layer 108 that would be used practically in the process would have excellent epitaxial properties.

After the epitaxial layer 108 is formed on the entire surface of the substrate, semiconductor devices such as light-emitting diode (LED) or power device may be then manufactured on the epitaxial layer 108. Since those semiconductor devices and relevant features are not the key points of the present invention, they will not be further described in the disclosure.

Figure 4:
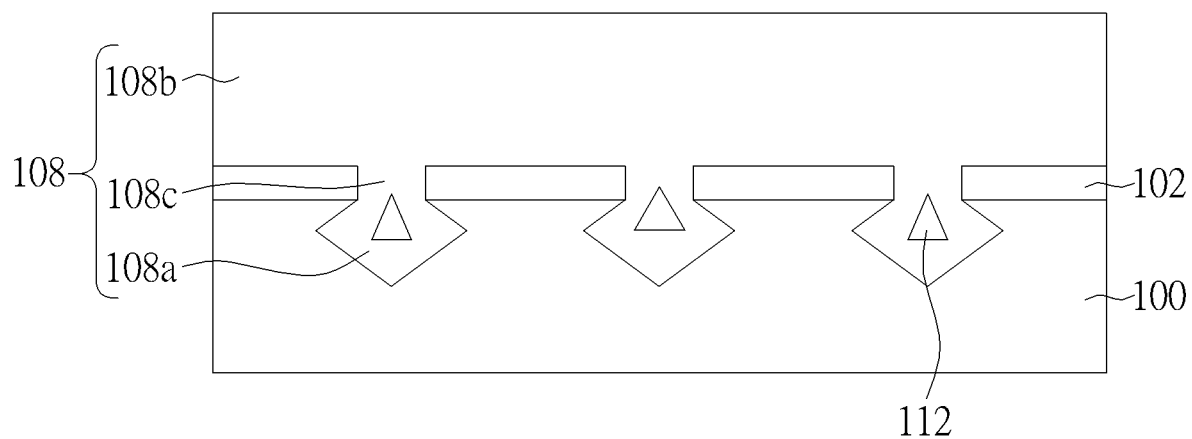
FIG. 4 is a schematic cross-section of a semiconductor structure with an epitaxial layer in accordance with another embodiment of the present invention.

Please refer to FIG. 4, which is a schematic cross-section of a semiconductor structure with an epitaxial layer in accordance with another embodiment of the present invention. As shown in FIG. 4, in this embodiment, void 112 may be formed inside the buried portion 108a of the epitaxial layer 108 in the recess 106. These voids 112 may also help to release the stress of the epitaxial layer. On the other hand, there may be no voids formed between the epitaxial layer 108 and the blocking layer 102.

Figure 5:
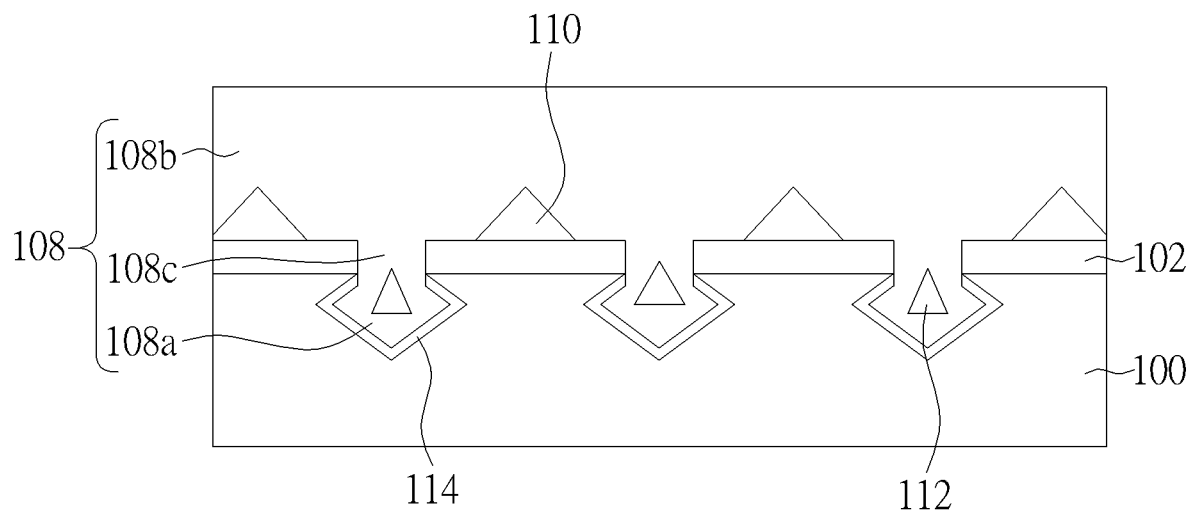
FIG. 5 is a schematic cross-section of a semiconductor structure with an epitaxial layer in accordance with another embodiment of the present invention.

Please refer to FIG. 5, which is a schematic cross-section of a semiconductor structure with an epitaxial layer in accordance with another embodiment of the present invention. In the embodiment of the present invention, a buffer layer 114 may be formed on the surface of the recesses 106 before performing the epitaxy process. The buffer layer 114 may have compositions similar to the epitaxial layer 108. For example, when the material of epitaxial layer 108 to be formed is GaN, the material of the buffer layer 114 may be selected from AlN or $Al_xGa_yN$. The buffer layer 114 may further mitigate the problem of lattice mismatch between the epitaxial layer 108 and the substrate 100, so that the epitaxial layer 108 to be formed thereon in later process would have a better quality.

Figure 6:
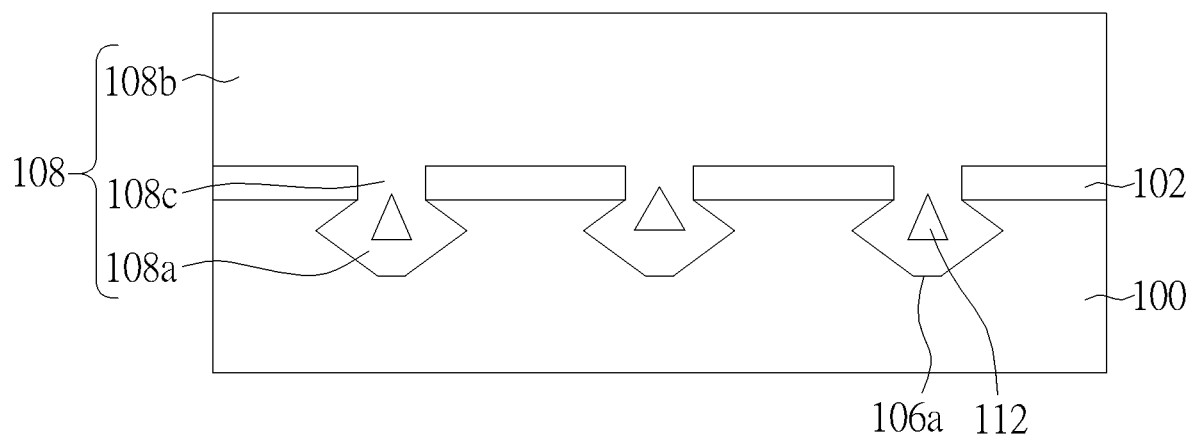
FIG. 6 is a schematic cross-section of a semiconductor structure with an epitaxial layer in accordance with still another embodiment of the present invention.

In other embodiment, for example in the condition that the slope wet etch process is not performed completely, the recess 106 formed in the substrate 100 may be in incomplete diamond shape with a horizontal bottom surface, as shown in FIG. 6.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure with an epitaxial layer, comprising:

a substrate;

a blocking layer on said substrate, wherein said blocking layer is provided with predetermined recess patterns;

multiple recesses formed in said substrate, wherein each of said multiple recesses is in 3D diamond shape with a centerline perpendicular to a surface of said substrate;

a buffer layer on a surface of each of said multiple recesses; and an epitaxial layer comprising a buried portion formed on said buffer layer in each of said multiple recesses and only one above-surface portion formed directly above said blocking layer and directly above said recess patterns of said blocking layer, and said above-surface portion directly connects said buried portion in each of said multiple recesses, and a first void is formed inside each of said buried portions of said epitaxial layer in said recess.

2. The semiconductor structure with an epitaxial layer of claim 1, further comprising multiple second voids formed between said above-surface portion of said epitaxial layer and said blocking layer.

3. The semiconductor structure with an epitaxial layer of claim 2, wherein each of said second voids is formed respectively between two said recesses.

4. The semiconductor structure with an epitaxial layer of claim 1, wherein said epitaxial layer further comprises multiple middle portions in said blocking layer, and each of said multiple middle portions connects said above-surface portion and one of said buried portions.

5. The semiconductor structure with an epitaxial layer of claim 1, wherein a material of said buffer layer is aluminum nitride or aluminum gallium nitride ($Al_xGa_yN$).

6. The semiconductor structure with an epitaxial layer of claim 1, wherein said recess extends along <111> crystal faces of said substrate.

7. The semiconductor structure with an epitaxial layer of claim 1, wherein said recess has a horizontal bottom surface.

8. The semiconductor structure with an epitaxial layer of claim 1, wherein said substrate is a silicon substrate with <100> crystal faces.

9. The semiconductor structure with an epitaxial layer of claim 1, wherein a material of said epitaxial layer is gallium nitride or aluminum gallium nitride ($Al_xGa_yN$).

* * * * *